United States Patent [19]

Hashimoto et al.

[11] Patent Number: 4,988,609
[45] Date of Patent: Jan. 29, 1991

[54] METHOD OF FORMING MICRO PATTERNS

[75] Inventors: Hidetsuna Hashimoto, Yokohama; Tiharu Kato, Kitakami; Hitoshi Tsuji, Yokohama, all of Japan

[73] Assignee: Kabushiki Kaisha Toshiba, Kawasaki, Japan

[21] Appl. No.: 205,938

[22] Filed: Jun. 13, 1988

[30] Foreign Application Priority Data

Jun. 18, 1987 [JP] Japan ............... 62-152165

[51] Int. Cl.$^5$ .............................. G03C 5/00
[52] U.S. Cl. ................... 430/326; 430/325; 430/328; 430/330; 430/394; 430/494
[58] Field of Search ............... 430/325, 326, 328, 330, 430/394, 494

[56] References Cited

U.S. PATENT DOCUMENTS 4,775,609 10/1988 McFarland .............. 430/325
4,863,827 9/1989 Jain et al. ................ 430/145

FOREIGN PATENT DOCUMENTS 32088 3/1980 Japan .

OTHER PUBLICATIONS

Spak et al., Proceedings of SPE Conf., "Polymers, Principles, Processing and Materials," ACS, Allenville, N.Y., Oct. 1985, pp. 247-269.
Chiong et al., "Image Reversal . . . " IBM Tech. Disclosure Bull., vol. 27, No. 1A, Jun. 1984, pp. 273-274.
Alling et al., "Image Reversal of Positive Photoresist a New Tool for Advancing Integrated Circuit Fabrication," SPIE vol. 539 Advances in Resist Technology and Processing II, pp. 194-218, (1985).
Moritz, "Optical Single Layer Lift-Off Process", IEEE Transactions on Electron Devices, vol. ED-32, No. 3, pp. 672-676, Mar. 1985.

Primary Examiner—Charles L. Bowers, Jr.
Assistant Examiner—Thomas R. Neville
Attorney, Agent, or Firm—Finnegan, Henderson, Farabow, Garrett and Dunner

[57] ABSTRACT

In a patterning method according to this invention, a surface region of a resist layer is solution-retarded by a developer, and, then, the resist layer is patterned. Therefore, a desired shape of a side wall of the resist layer may be obtained by varying a solubility of the resist layer, with the result that a resist pattern with the side wall orthogonal to a surface of the substrate or the overhung side may be formed.

6 Claims, 2 Drawing Sheets

METHOD OF FORMING MICRO PATTERNS

BACKGROUND OF THE INVENTION

1. Field of the Invention

This invention relates to a method of patterning a resist layer, and more particularly to a method of forming micro patterns.

2. Description of the Related Art

A conventional method of patterning a material layer will be described by referring to FIGS. 1A–1C. As shown in FIG. 1A, a material layer denoted as 15, for example, an $SiO_2$ film, is formed on semiconductor substrate 14 of, for example, silicon Resist layer 16 is formed on material layer 15. As shown in FIG. 1B, an exposing device is used, and resist layer 16 is irradiated with light rays projected through a mask pattern or a reticule (not shown) having a predetermined pattern. The resultant structure is subjected to a development process, to form a resist pattern as shown in FIG. 1C. Further, material layer 15 is etched with a mask of the resist pattern. In this way, material layer 15 is patterned.

When using the conventional patterning method as mentioned above, a cross sectional configuration of the side wall of the developed resist pattern varies with respect to the kind of resist material, developer, and the type of the exposing device used. It is, therefore, very difficult, to obtain a resist pattern having a desired side wall shape. Ideally, the side wall of the resist pattern should be orthogonal to the surface of semiconductor substrate 14. In the case of a resist pattern type wherein a difference between the solubility of the exposed part of the pattern and that of the unexposed part thereof is small, the configuration of the side wall of resist pattern 16 is shaped such that when viewed in the drawing, the configuration flares upwards, as shown in FIG. 1C. In other words, the cross sectional shape of the side wall resembles a reversed trapezoid. This resultant shape of the side wall is due to the fact that the amount of exposing light which reaches the edges of the etched portion of resist layer 16 is smaller than the amount of exposing light which reaches the central part thereof, and the fact that the amount of exposing light decreases towards the deep portion of resist layer 16. Particularly, in forming a micro pattern, it is difficult to form a resist pattern having a side wall which is orthogonal to the surface of semiconductor substrate 14. When the lift-off process is used for the patterning of the resist layer, it is desirable that the side wall of the resist layer be shaped to have an overhang If the side wall of the resist layer is so shaped, it will be easier to disconnent a metal layer to be later layered over the resist layer. The conventional patterning method as mentioned above, however, cannot form the resist pattern so as to have such an overhanging side wall.

As described with reference to FIGS. 1A to 1C, the conventional method of forming micro patterns includes the process steps of resist coating, exposure, and development, which are executed in this order. In the conventional method, the shape of the side wall of the resist pattern varies with respect to the kind of resist material, developer, and the type of the exposing device used. This makes it difficult to form resist patterns having side walls of a desired shape.

SUMMARY OF THE INVENTION

Accordingly, an object of this invention is to provide a method of forming micro patterns, which can form resist patterns having side walls of a desired shape.

According to this invention, there is provided a method of forming micro patterns comprising the steps of: forming a resist layer on a material layer to be processed; irradiating said resist layer with ultraviolet rays or deep-ultraviolet rays; baking or thermally heating the resist layer in an ammonia gas or in an atmosphere, thereby solution-retarding the surface region of said resist layer by the developer used; exposing the resist layer to rays of light to form a predetermined pattern on the resist layer; and developing the resist layer to form a resist pattern.

In the patterning method according to this invention, the surface region of the resist layer is solution-retarded by the developer, and, then, the resist layer is patterned. Therefore, a side wall of the resist layer having a desired shape may be obtained by varying a solubility of the resist layer, with the result that a resist pattern having the side wall orthogonal to the substrate surface or with an overhang may be formed.

DETAILED DESCRIPTION OF THE PREFERRED EMBODIMENTS

Some specific embodiments of a method for forming micro patterns according to this invention will be described with reference to the accompanying drawings.

A sequence of the steps involved in forming a micro pattern according to an embodiment of this invention are illustrated in FIGS. 2A to 2D.

PROCESS 1 (FIG. 2A)

Layer 15 to be processed made of, for example, $SiO_2$ is formed on semiconductor substrate 14 which is made of, for example, silicon. Layer 15 is coated with a positive resist material, thereby forming positive resist layer 16. Thereafter, positive resist layer 16 is irradiated with ultraviolet rays or deep-ultraviolet rays.

PROCESS 2 (FIG. 2B)

The resist layer is baked or thermally heated at about 80° C. to about 120° C. in an ammonia gas. If the resist contains a material from the family of amine, it may be baked or thermally heated in an atmosphere. As the result of this heating process, layer 16a is formed on the surface region of resist layer 16. This layer 16a is solution-retarded by a developer used.

PROCESS 3 (FIG. 2C)

An exposing device is used which projects the rays of light 18 onto resist layer 16 through a mask (not shown) having a predetermined pattern, thereby forming the pattern on the resist layer.

PROCESS 4 (FIG. 2D)

A developer is applied to resist layer 16, to remove the exposed portion and form a resist pattern thereon.

Figure 1A:
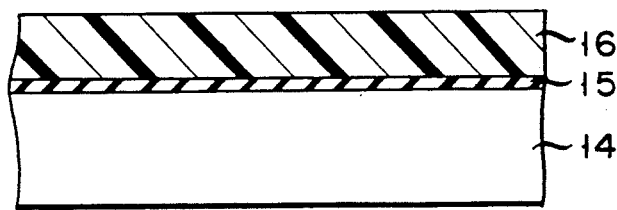
FIGS. 1A to 1C show sectional views of structures obtained in carrying out a sequence of steps for forming a micro pattern by a conventional micro pattern forming method.
Figure 1B:
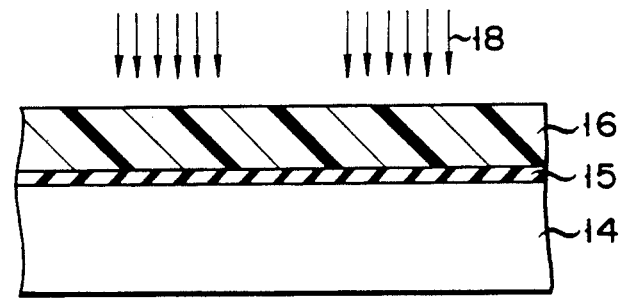
Figure 1C:
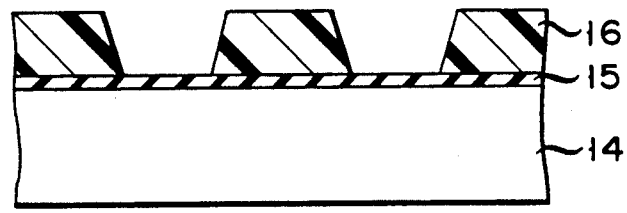
Figure 2A:
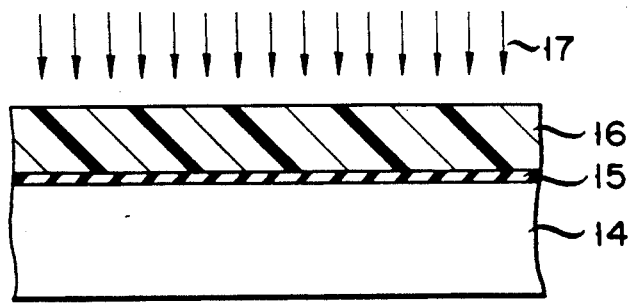
FIGS. 2A to 2D show sectional views of structures obtained in carrying out a sequence of steps for forming a micro pattern by a micro pattern forming method according to an embodiment of this invention.
Figure 2B:
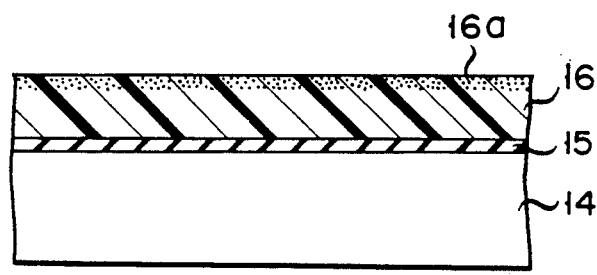
Figure 2C:
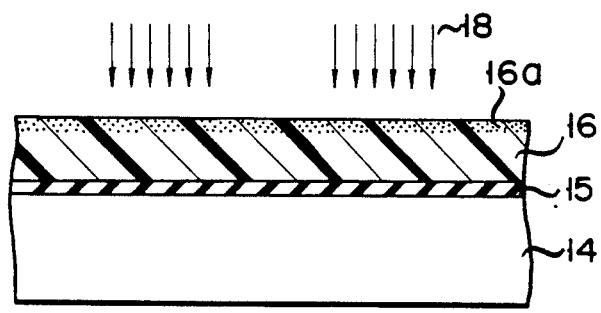
Figure 2D:
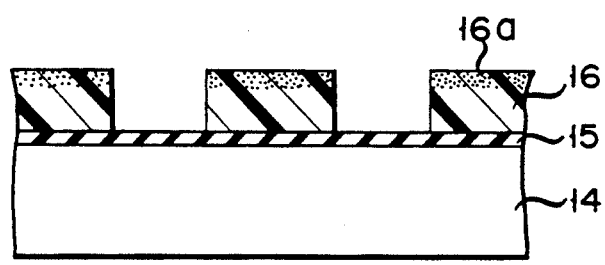
Figure 3:
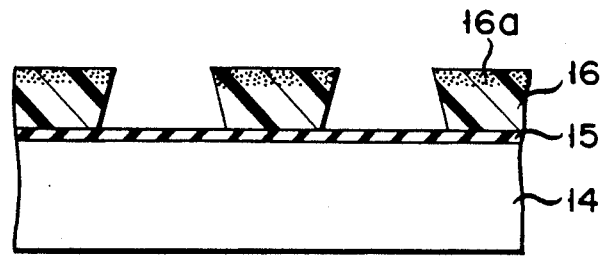
FIGS. 3 and 4, respectively, show sectional views of the resist patterns formed by other embodiments of this invention.
Figure 4:
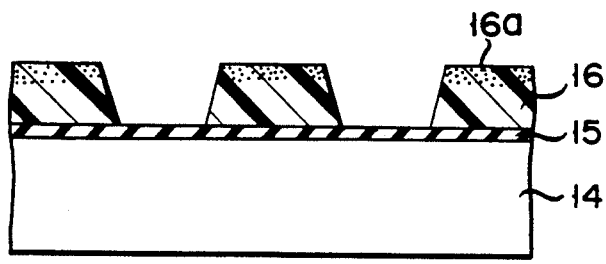

In the structure thus formed, the upper layer 16a of resist layer 16 is solution-retarded by the developer, while the lower layer remains intact. Therefore, if a solubility of the upper layer 16a with respect to the developer is selected to have a proper value, the etching rate of the upper layer of resist layer 16 may be equal to that of the lower layer. The side wall of the resultant patterned resist layer is orthogonal to the surface of semiconductor substrate 14. The thickness and/or the solubility of the unsoluble layer 16a may be varied by controlling the irradiation energy of ultraviolet or deep-ultraviolet rays 17 (PROCESS 1), and/or the temperature and/or the time of the baking process in the ammonia gas or an atmosphere (PROCESS 2). The illustration of FIG. 2D is an example of the resist pattern formed by a method of this invention. As shown in FIG. 3, another pattern having a side wall which has an overhang or which resembles a reversed trapezoid, is formed by either increasing the irradiation energy of the exposing rays, the baking temperature, or the baking time. A further resist pattern with a trapezoidal side wall shown in FIG. 4 may be formed by either decreasing the irradiation energy of the exposing rays, the baking temperature, or the baking time. Thus, according to this invention, resist patterns may be formed which have side walls of any shape, such as rectangular, overhanging, or trapezoidal as shown in FIGS. 2D, 3 and 4, respectively.

Some specific examples of the resist patterning method based on the above technical idea of this invention will be described.

EXAMPLE 1

This example provides a resist pattern having a side wall which is orthogonal to the surface of semiconductor substrate 14, as shown in FIG. 2D.

To begin with, silicon substrate 14 is thermally heated, and layer 15, made of $SiO_2$, is formed on the substrate. $SiO_2$ film 15 is coated with positive resist OFPR-800 (manufactured by Tokyo Ouka Kougyou Co., Ltd, Japan), to form resist layer 16 having a thickness of 1.5 $\mu$m. The resist layer is irradiated with 20 mW/cm$^2$ ultraviolet rays for 8 seconds. Then the resist layer is baked at 95° C. for 20 minutes in an ammonia gas at 600 mmTorr of pressure. Subsequently, the resist layer is exposed with 20 mW/cm$^2$ of light rays for 600 msec to form a pattern thereon. A reduction type projector is used for projecting the light rays onto the resist layer. Further, the resist layer is developed using developer NMD-3 (manufactured by Tokyo Ouka Kougyou Co., Ltd). A resist pattern obtained by this method has a side wall which is orthogonal to the surface of semiconductor substrate 14, as shown in FIG. 2D.

EXAMPLE 2

This second example, like Example 1, provides a resist pattern having a side wall which is orthogonal to the surface of semiconductor substrate 14, as shown in FIG. 2D.

Silicon substrate 14 is thermally heated, and layer 15, made of $SiO_2$, is formed on the substrate. $SiO_2$ film 15 is coated with positive resist NPR-820 (manufactured by Nagase Sangyou Co., Ltd, Japan), to form resist layer 16 having a thickness of 1.5 $\mu$m. The resist layer is irradiated with 20 mW/cm$^2$ of ultraviolet rays for 8 seconds. Then, the resist layer is baked at 95° C. for 20 minutes in an ammonia gas at 600 mmTorr of pressure. Subsequently, the resist layer is exposed with 500 mW/cm$^2$ of light ray for 900 msec to form a pattern thereon. A reduction type projector is used for projecting the light rays onto the resist layer. Further, the resist layer is developed using developer NAGASE 934 (manufactured by Nagase Sangyou Co., Ltd). A resist pattern obtained by this method has a side wall which is orthogonal to the surface of semiconductor substrate 14, as shown in FIG. 2D.

EXAMPLE 3

This example provides a resist pattern having a side wall which has an overhang or which resembles a reversed trapezoid as shown in FIG. 3.

As a first step, silicon substrate 14 is thermally heated, and layer 15, made of $SiO_2$, is formed on the substrate. $SiO_2$ film 15 is coated with positive resist AZ-5214 (manufactured by Hoechst Japan Co., Ltd) to form resist layer 16 having a thickness of 1.5 $\mu$m. The resist layer is irradiated with 20 mW/cm$^2$ of ultraviolet rays for 10 seconds. Then, the resist layer is baked at 115° C. for 5 minutes in an atmosphere. Subsequently, the resist layer is exposed by 500 mW/cm$^2$ of light rays light for 1500 msec to form a pattern thereon. A reduction type projector is used for projecting the light rays. Further, the resist layer is developed using developer MF-314 (manufactured by Hoechst Japan Co., Ltd). A resist pattern obtained by this method has either a side wall with an overhang or a side wall which resembles a reversed trapezoid, as shown in FIG. 3.

As described above, the method of forming micro resist patterns of the present invention can provide a side wall of a resist pattern having any desired form, such as a side wall which is orthogonal to the surface of the semiconductor substrate, side wall resembling a reversed trapezoid, and the trapezoidal side wall form.

What is claimed is:

1. A method of forming micro patterns comprising the steps of:
   forming a resist layer on a layer to be processed;
   exposing said entire resist layer to rays of light;
   thereafter thermally heating said resist layer, to form a layer on a surface region of said resist layer, with said formed layer being solution-retarded by a developer;
   immediately following the thermally heating step, exposing only selected portions of said resist layer to rays of light, thereby forming a predetermined pattern thereon; and
   developing said resist layer.

2. The method of forming micro patterns according claim 1, wherein said first-recited rays of light are ultraviolet rays.

3. The method of forming micro patterns according to claim 1, wherein said first-recited rays of light are deep-ultraviolet rays.

4. The method of forming micro patterns according to claim 1, wherein said thermally heating of said resist layer is performed in an atmosphere.

5. The method of forming micro patterns according to claim 1, wherein said resist layer is of the positive resist type.

6. A method of forming micro patterns comprising the steps of:
   forming a resist layer on a layer to be processed;
   exposing said entire resist layer to rays of light;

thereafter thermally heating said resist layer in an ammonia gas, to form a layer on a surface region of said resist layer, with said formed layer being solution-retarded by a developer;

thereafter exposing only selected portions of said resist layer to rays of light, thereby forming a predetermined pattern thereon; and developing said resist layer.

* * * * *